US008441782B2

(12) United States Patent
Thomas

(10) Patent No.: US 8,441,782 B2

(45) Date of Patent: May 14, 2013

(54) WALL-MOUNTED COMPUTER WORK STATION

(75) Inventor: Rendell Thomas, Farmington, MI (US)

(73) Assignee: Enovate IT, Canton, MI (US)

( * ) Notice: Subject to any disclaimer, the term of this patent is extended or adjusted under 35 U.S.C. 154(b) by 342 days.

(21) Appl. No.: 13/036,709

(22) Filed: Feb. 28, 2011

(65) Prior Publication Data

US 2012/0218701 A1 Aug. 30, 2012

(51) Int. Cl.
*G06F 1/16* (2006.01)
*H05K 5/00* (2006.01)
*H05K 7/00* (2006.01)

(52) U.S. Cl.
USPC ............. 361/679.02; 361/679.21; 361/679.23

(58) Field of Classification Search ............. 361/679.02, 361/679.08, 679.21–679.23
See application file for complete search history.

(56) References Cited

U.S. PATENT DOCUMENTS 750,193 A 1/1904 James
1,228,042 A 5/1917 O'Dowd
3,431,002 A 3/1969 Melgaard
4,861,121 A 8/1989 Gotz
D321,340 S * 11/1991 Savio ........................... D14/335
5,262,762 A 11/1993 Westover et al.
5,281,018 A 1/1994 Cullinan
D349,693 S 8/1994 Brossardt
5,646,819 A 7/1997 Hill, III
5,673,169 A * 9/1997 Wicks ........................ 361/679.4
5,707,126 A 1/1998 Neufeld et al.
5,740,744 A 4/1998 Nashirozawa et al.
6,189,849 B1 2/2001 Sweere et al.
6,483,695 B1 * 11/2002 Hartstein ................. 361/679.09
6,490,154 B2 * 12/2002 Thompson ............... 361/679.41
6,646,863 B1 11/2003 White et al.
6,733,094 B1 5/2004 Chang
6,956,735 B2 10/2005 Lee et al.
6,994,306 B1 2/2006 Sweere et al.

(Continued)

FOREIGN PATENT DOCUMENTS

JP 8223797 8/1996
JP 2002041177 2/2002

OTHER PUBLICATIONS

Ergotron, "StyleView® Vert. Lift, High Traffic: Areas," Part # 60-593-216, www.ergotron.com/Products/tabid/65/PRDID/251/language/en-US/Default.aspx, accessed Oct. 31, 2010 (2 pgs).

(Continued)

*Primary Examiner* — Adrian S Wilson
(74) *Attorney, Agent, or Firm* — Dierker & Associates, P.C.

(57) ABSTRACT

Computer workstation includes a mounting bracket for attachment to a wall, and a cabinet connected to the mounting bracket. A track, attached to the cabinet, is engaged with the mounting bracket to vertically guide the cabinet. A non-contacting sensor detects a computer operator. An input device tray is rotatably connected to the cabinet, and has i) an operating position that holds computer input device(s) in an input position and ii) a stowed position substantially preventing access. First electromagnet selectively retains the tray in the stowed position. Second electromagnet selectively retains the tray in the operating position. An electronic lock control panel accepts authentication input from the operator. An electronic lock control module, in a lockable compartment of the cabinet, is connected to the lock control panel and the sensor. The lock control module separately controls electric current flow through the electromagnets in response to authentication by the lock control module.

15 Claims, 9 Drawing Sheets

U.S. PATENT DOCUMENTS

| | | | | |
|---|---|---|---|---|
| 7,029,079 | B2 * | 4/2006 | Holt | 312/223.3 |
| 7,158,373 | B2 * | 1/2007 | Smith | 361/679.18 |
| D611,047 | S | 3/2010 | Smith et al. | |
| 7,775,424 | B1 | 8/2010 | Helzer et al. | |
| 7,826,205 | B2 * | 11/2010 | Smith | 361/679.02 |
| 2002/0104271 | A1 | 8/2002 | Gallant | |
| 2004/0148958 | A1 | 8/2004 | Park | |
| 2007/0047193 | A1 * | 3/2007 | Smith | 361/683 |
| 2007/0247800 | A1 * | 10/2007 | Smith et al. | 361/683 |
| 2008/0168930 | A1 | 7/2008 | Calero | |
| 2009/0179121 | A1 | 7/2009 | Lindblad et al. | |
| 2010/0111363 | A1 | 5/2010 | Kelly et al. | |
| 2010/0148647 | A1 * | 6/2010 | Burgess et al. | 312/327 |
| 2012/0268878 | A1 | 10/2012 | Smith | |

OTHER PUBLICATIONS

Ergotron, "StyleView® VL Enclosure," Prod Part # 60-595-062, www.ergotron.com/Products/tabid/65/PRDID/294/language/en-US/Default.aspx, accessed Oct. 31, 2010 (3 pgs).
Erogotron Vertical Lift Auto-Retracting Keyboard Kit, Prod Part #97-487-800, SKU # EG1267, www.homedecorating.com/Erogtron-97-487-800-EG1267.html, accessed Oct. 31, 2010 (2 pgs).
http://www.rubbermaidmedical.com/Products/WallMamtWorkStations/Pages/Default.aspx, last accessed Mar. 9, 2011 (1 pg).
Enovate, "e550 Wall Station" brochure, Canton, Michigan Mar. 2010 (2 pgs).

* cited by examiner

WALL-MOUNTED COMPUTER WORK STATION

BACKGROUND

The present disclosure relates generally to computer workstations and, more particularly, to a wall-mounted computer workstation. Health care providers are mandated by the Health Insurance Portability and Accountability Act (HIPAA) to take reasonable steps to ensure the confidentiality of patient information. Computer terminals located in hospital corridors outside examination rooms or in other public areas give healthcare practitioners efficient, accurate access to information technology. However, it can be difficult to provide convenient access for authorized computer operators while reasonably preserving patient information confidentiality as required by HIPAA.

BRIEF DESCRIPTION OF THE DRAWINGS

Features and advantages of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1A:
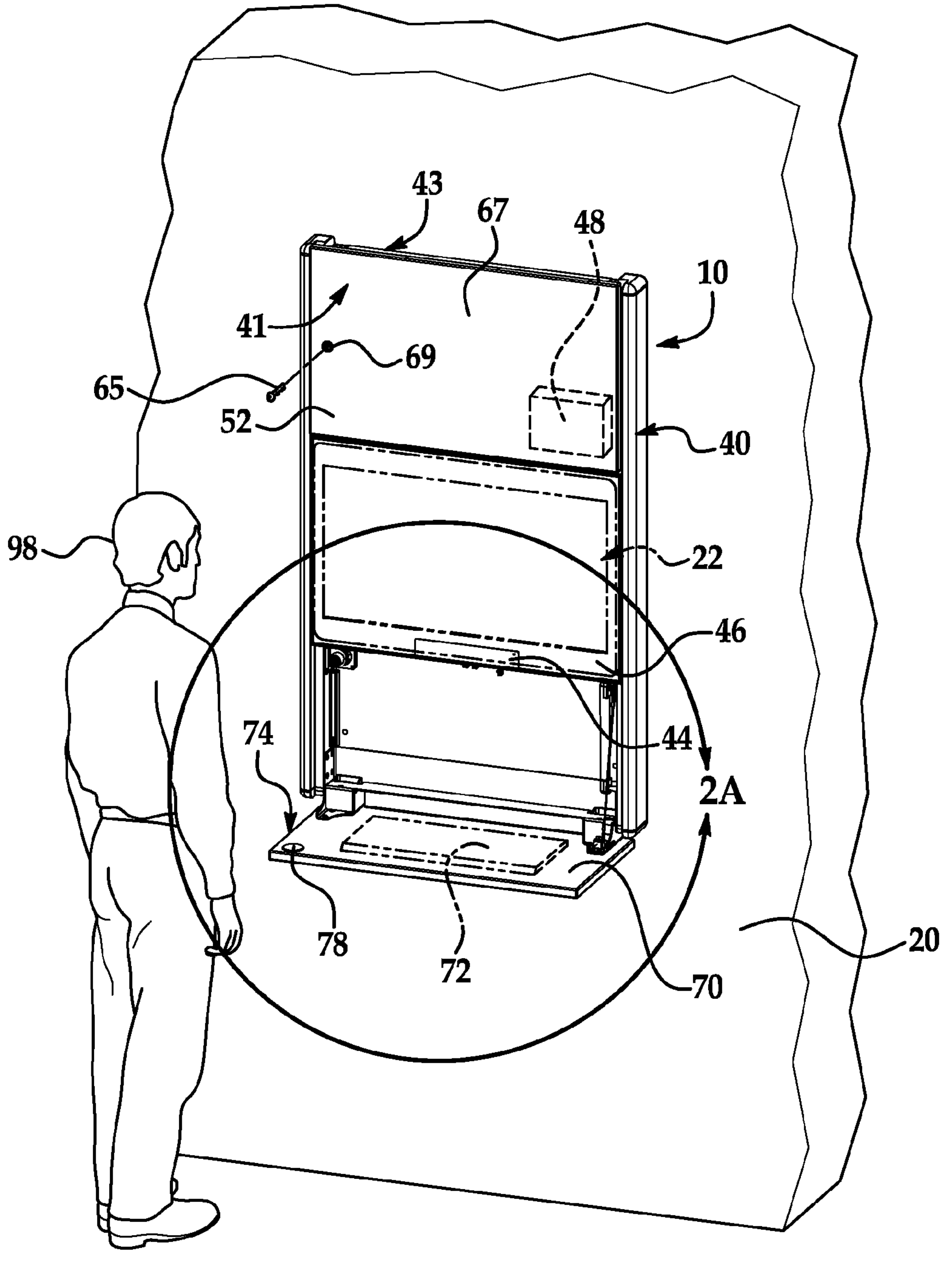
FIG. 1A is a perspective view of an example of the wall-mounted computer workstation of the present disclosure.

Healthcare providers have found it convenient and efficient to provide computer workstations near the points of patient service. For example, computer workstations may be installed in patient examination rooms or in hallways near patient rooms (e.g., in a hospital). In many instances, the computer workstations are positioned in areas without controlled access. Areas with controlled access may include, for example, a doctor's office with a lockable door. In areas with uncontrolled access, a member of the public, a patient, or some other person without authorization may physically gain unsupervised access to a computer workstation. Such unsupervised and unauthorized access to the workstation may include viewing a computer monitor or operating the computer workstation via a keyboard, mouse, or other user interface. Computer authentication systems and screen savers do provide a level of protection; however, unauthorized users may gain access by exploiting vulnerability to take-over of an authorized computer session.

Examples of the wall-mounted computer workstation disclosed herein provide an additional level of protection against unauthorized access to confidential information. Examples of the wall-mounted computer workstation as described herein automatically close a keyboard tray when the computer workstation is not in use, and do not require an authorized user to hold the tray open during use of the computer workstation. Additionally, examples of the wall-mounted computer workstation disclosed herein are operable with ergonomic comfort and are available in a package that is unobtrusive to busy corridors when access to the computer workstation is not required. Referring now to FIGS. 1A, 1B, 2A, and 2B together, a wall-mounted computer workstation 10, including a mounting bracket 30 for fixable attachment to a wall 20 is depicted. The wall 20 may be a load-bearing or a non-load-bearing, generally vertical wall in a building (not shown). It is to be understood that building construction practices may not, in some instances, render walls that are exactly flat or precisely vertical. As such, the wall 20 to which the computer workstation 10 is attached may have imperfections, be slightly angled, etc. Further, in addition to stationary buildings, movable buildings, such as trailers, military mobile hospitals, ships, and aircraft may have examples of the wall 20 as disclosed herein.

A cabinet 40 is operatively connected to the mounting bracket 30. The cabinet 40 has a front side 41 that faces away from the wall 20 when the cabinet 40 is mounted to the wall 20, and a rear side 43 that is adjacent to (or faces) the wall 20 when the cabinet is mounted to the wall 20. In one example, a track 32 is rigidly attached to the cabinet 40 and operably engaged with the mounting bracket 30 to guide the cabinet 40 in a vertical direction. It is to be understood that as used herein, the vertical direction may be within 10 degrees of plumb, and is generally meant to mean "up" and "down." The track 32 may also be integrally formed with the cabinet 40.

A non-contacting sensor 90 is operably disposed on the cabinet 40 to detect a presence of a computer operator 98. It is to be understood that the non-contacting sensor 90 may include an infra-red sensor, an ultra-sonic sensor, a biometric sensor, a microphone, and combinations thereof. Biometric sensors may include cameras and associated electronics with facial recognition capability, fingerprint scanners, and/or weight scales. An example of an infra-red sensor is the Sharp brand optical analog distance sensor #GP2Y0A02YK0F available from Pololu Corporation, Las Vegas, Nev. The wall-mounted computer workstation 10 also includes an input device tray 70 that receives and supports at least one computer input device 72. In one example, the tray 70 is rotatably connected to the cabinet 40. The tray 70 has an operating position 74 such that the at least one computer input device 72 is held in an input position (see, e.g., FIGS. 1A and 2A), and has a stowed position 76 such that access to the at least one computer input device 72 is substantially prevented (see, e.g., FIG. 2B). It is to be understood that the computer input device(s) 72 may include a keyboard, mouse, joystick, touch-pad and combinations thereof.

A first electromagnet 80 is disposed on the cabinet 40 to selectively magnetically retain the input device tray 70 in the stowed position 76. A second electromagnet 82 is disposed on the cabinet 40 to selectively magnetically retain the input device tray 70 in the operating position 74 (see FIG. 4). An electronic lock control panel 44 is operably disposed on an exterior surface 46 of the cabinet 40 to accept authentication input from the operator 98. The electronic lock control panel 44 may include a keypad, which has visible symbols, alpha-numeric characters, and/or combinations thereof. The keypad may have touch sensitive pads, or may include mechanical buttons or contacts.

Figure 11:
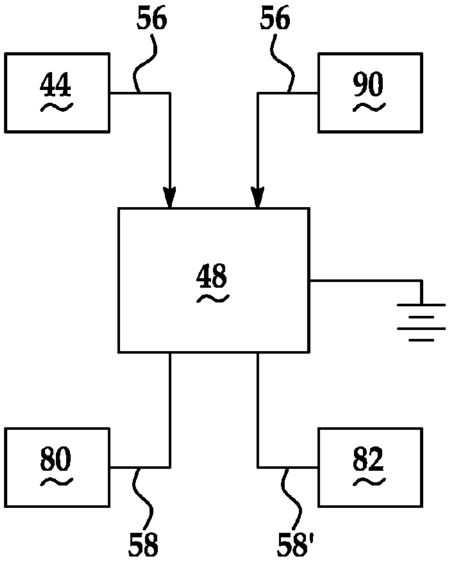
FIG. 11 is a schematic system context diagram depicting an example of an electronic lock control module of the present disclosure.

In an example, a lockable compartment 52 of the cabinet 40 may have a door 67 with a mechanical lock 69 that may be opened and closed with a key 65. An electronic lock control module 48 may be disposed in the lockable compartment 52. As schematically illustrated in FIG. 11, the lock control module 48 may be connected to receive signals 56 from the electronic lock control panel 44 and the non-contacting sensor 90. The lock control module 48 is connected to the first and second electromagnets 80, 82 to separately control electric current flow 58, 58' through the first and second electromagnets 80, 82 in response to an authentication by the lock control module 48. It is to be understood that separately controlling electric current flow 58, 58' means that the current may flow to the first and second electromagnets 80, 82 independently. That is, electric current flow 58 may cause the first electromagnet 80 to be energized when there is an absence of electric current flow 58' to the second electromagnet 82. Conversely, electric current flow 58' may cause the second electromagnet 82 to be energized when there is an absence of electric current flow 58 to the first electromagnet 80.

The first and second electromagnets 80, 82 are in an energized state when electric current 58, 58' flows through windings (not shown) of the respective electromagnets 80, 82. Similarly, first and second electromagnets 80, 82 are in a de-energized state when there is no electric current flow 58, 58' through windings (not shown) of the respective electromagnets 80, 82.

Referring back to FIGS. 1A, 1B, 2A and 2B, in an example of the wall-mounted computer workstation 10, the authentication by the lock control module 48 causes the first electromagnet 80 to release the input device tray 70 to allow the tray 70 to be rotated into a magnetic engagement zone 68 (see FIG. 2A) and to be magnetically retained by the second electromagnet 82 in the operating position 74 until authentication is revoked. It is to be understood that rotation of the input device tray 70 toward the operating position 74 is accomplished manually by the computer operator 98. The magnetic engagement zone 68 is a position of the input device tray 70 which places the input device tray 70 in a position to be magnetically drawn toward the second electromagnet 82 and held in the operating position 74 by the first electromagnet 80. Generally, the magnetic engagement zone is less than 1 degree of rotation from the operating position 74. In an example, the magnetic engagement zone 68 may be within about 0.5 degrees of rotation from the operating position 74.

An absence of the authentication by the lock control module 48 causes the second electromagnet 82 to release the input device tray 70 such that the tray 70 automatically rotates to the stowed position 76 and is retained in the stowed position 76 by the first electromagnet 80.

Examples may further include a first magnetically responsive strike plate 78 disposed on the input device tray 70. In an example, the first magnetically responsive strike plate 78 may be a steel disk, about 40 mm in diameter and about 12 mm thick. In another example, the diameter of a disk shaped strike plate 78 may be up to 50 mm. In still another example, the strike plate 78 may be rectangular or oblong, and may be less than 12 mm thick. Other shapes and/or sizes may also be suitable for the first magnetically responsive strike plate 78. The strike plate 78 should be thick enough to avoid magnetic saturation when in contact with the magnet, thereby allowing the magnet to exert maximum attraction. The strike plate 78 may be formed from any magnetically responsive metal or alloy that can be attracted by the magnetic field of an electromagnet (e.g., electromagnet 80). The strike plate 78 may be a single layer of a magnetically responsive metal or alloy, or may be formed from multiple layers in a stack (not shown). The strike plate 78 may also be formed from a composite of plastic resin and magnetically responsive metal.

Figure 1B:
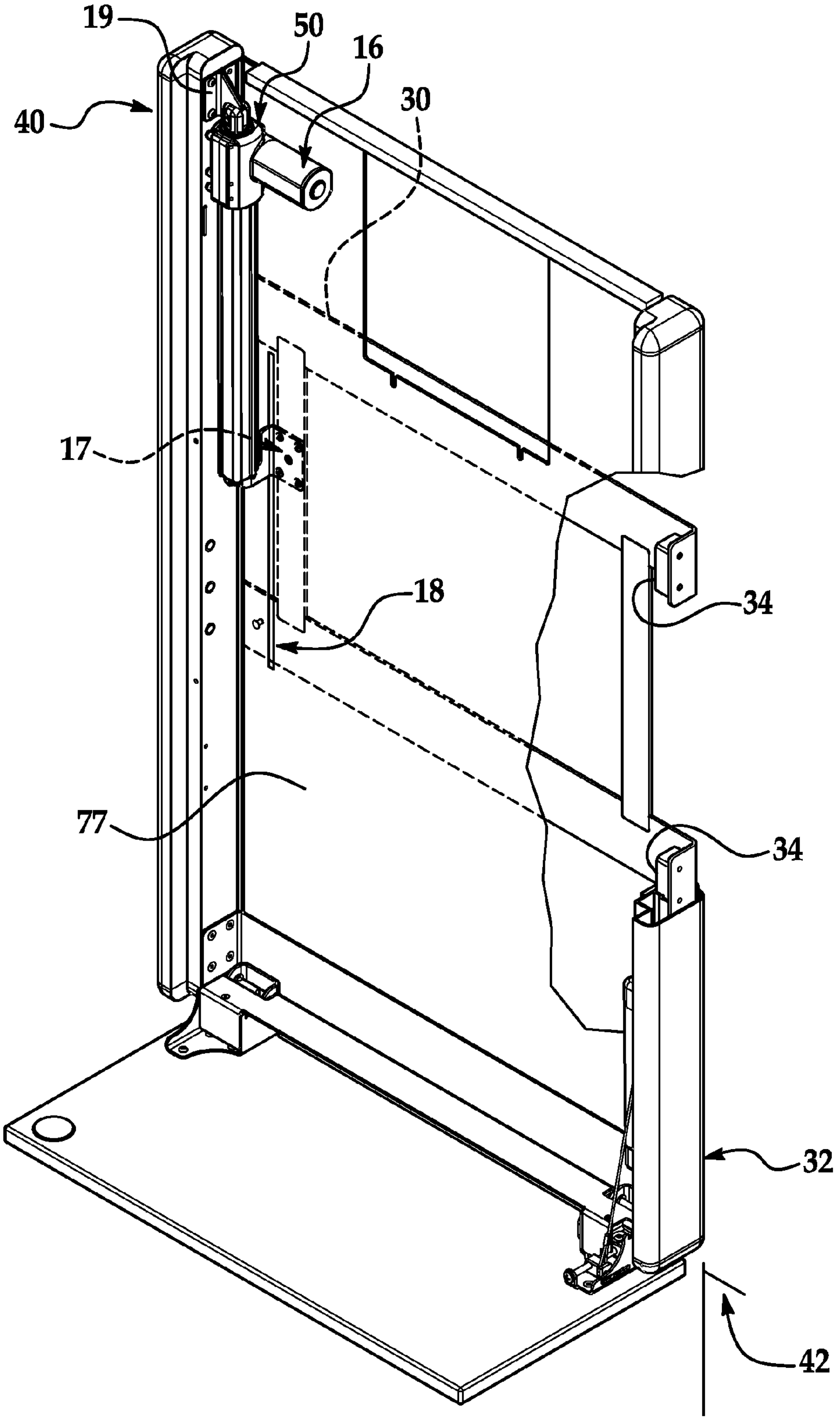
FIG. 1B is a partial cutaway perspective view of a portion of an example of the wall-mounted computer workstation of the present disclosure.

As depicted in FIG. 1B, examples of the wall-mounted computer workstation 10 may further have an electric-powered linear drive assembly 50 rigidly attached to the cabinet 40 and operably connected to the mounting bracket 30. The electric-powered linear drive assembly 50 may be for adjusting a vertical position 42 of the cabinet 40 along the track 32. In an example, the electric-powered linear drive assembly 50 may be attached to the mounting bracket 30 by an attachment bracket 17 disposed through a slot 18 in the web sheet 77. The slot 18 allows the cabinet 40 to move vertically without the attachment bracket 17 crashing into moving portions of the cabinet 40.

The electric-powered linear drive assembly 50 may include, for example, a DC electric motor 16 to drive a screw (not shown) attached to the cabinet 40 by a cantilever bracket 19. It is to be understood that the motor 16 may drive the screw (not shown) directly, or indirectly through an intervening drive train including worms, gears, or combinations thereof. The screw (not shown) driven by the DC electric motor 16 may turn and move linearly relative to a stationary nut (not shown). In another example, the screw (not shown) may engage a rotating nut (not shown) and move linearly without rotating the screw.

Figure 3:
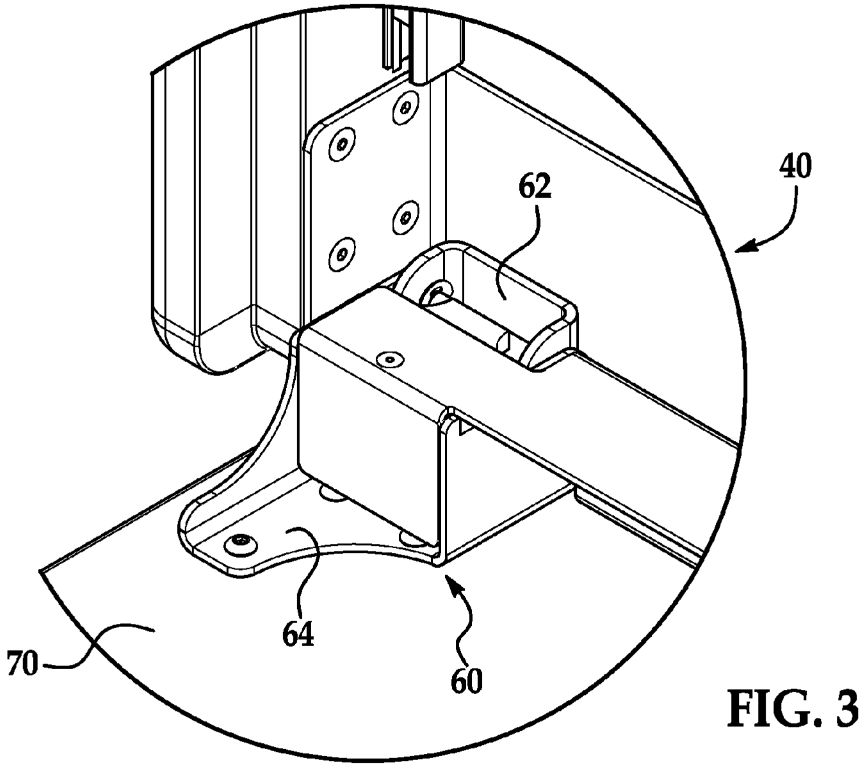
FIG. 3 is a detailed right front perspective view of a left hinge area of the example of the wall-mounted computer workstation depicted in FIG. 1A.
Figure 4:
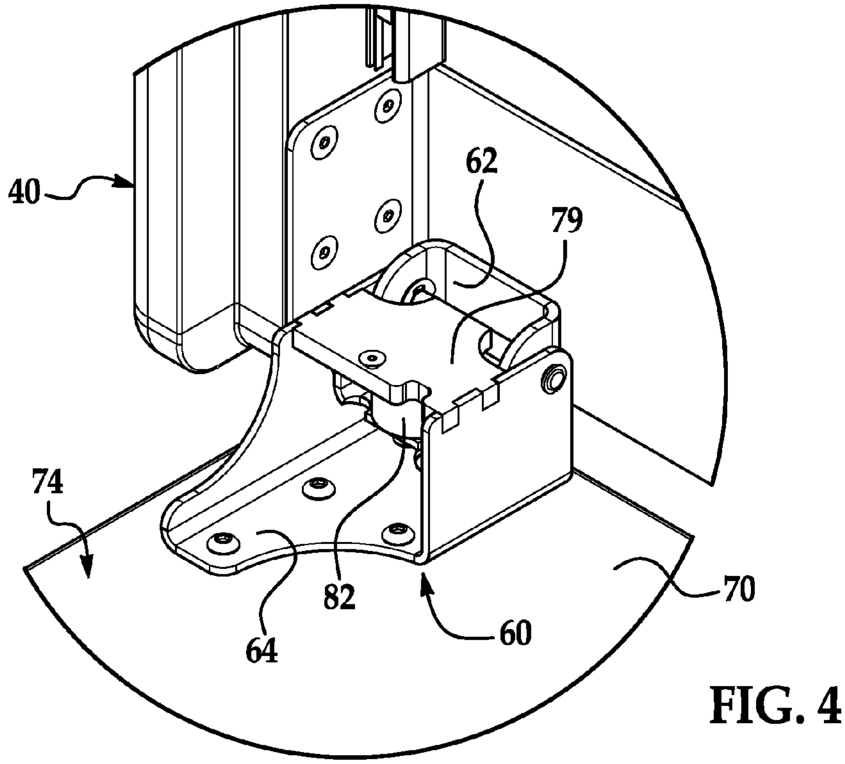
FIG. 4 is a detailed right front perspective view of the left hinge area depicted in FIG. 3 illustrated with the fascia removed.
Figure 5:
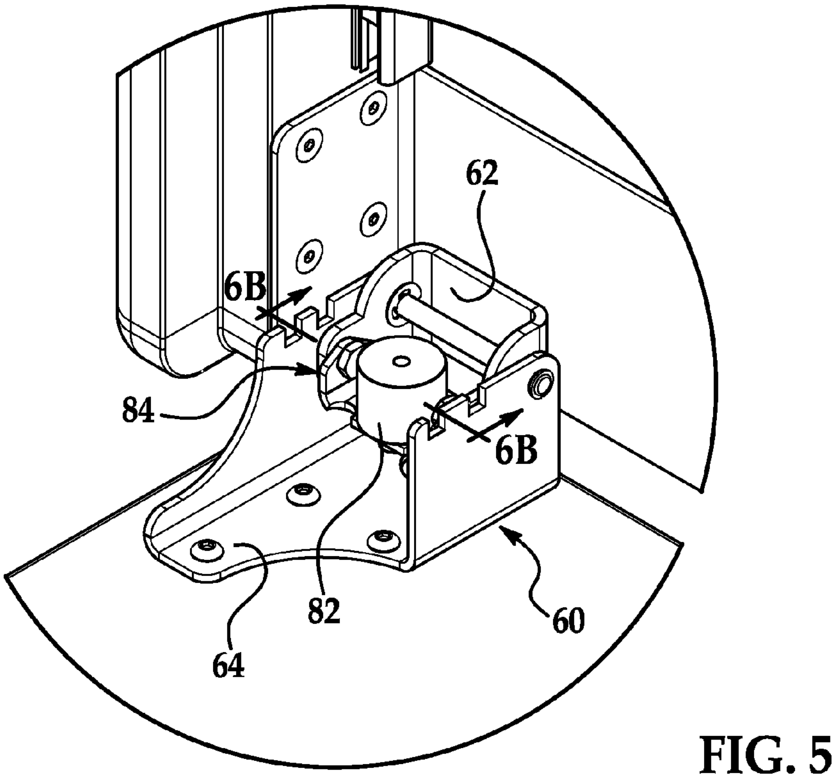
FIG. 5 is a detailed right front perspective view of the left hinge area depicted in FIG. 4 illustrated with the strike plate removed.
Figure 6A:
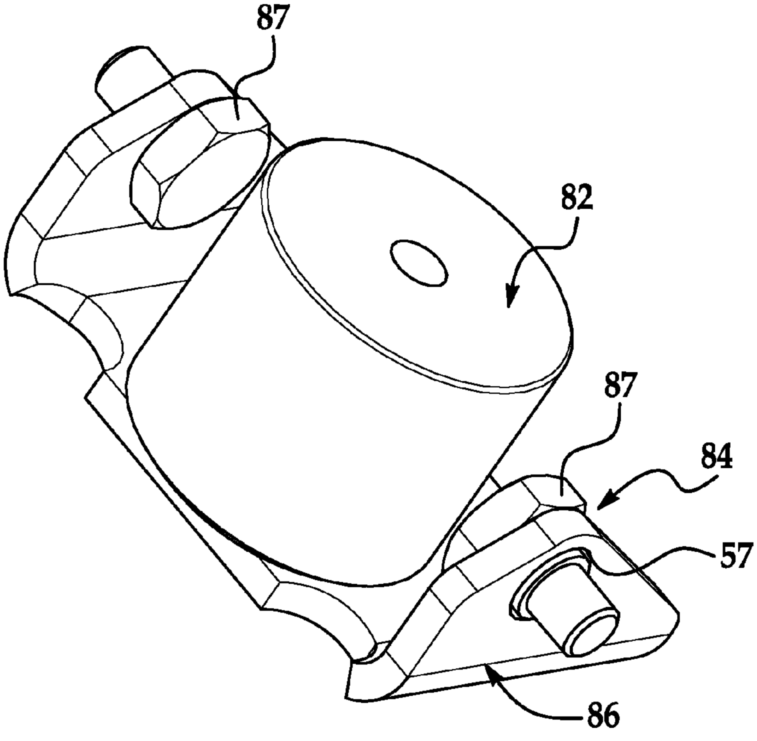
FIG. 6A is a detailed right front perspective view of the self-aligning mount depicted in FIG. 5 showing details of the mounting flange.
Figure 6B:
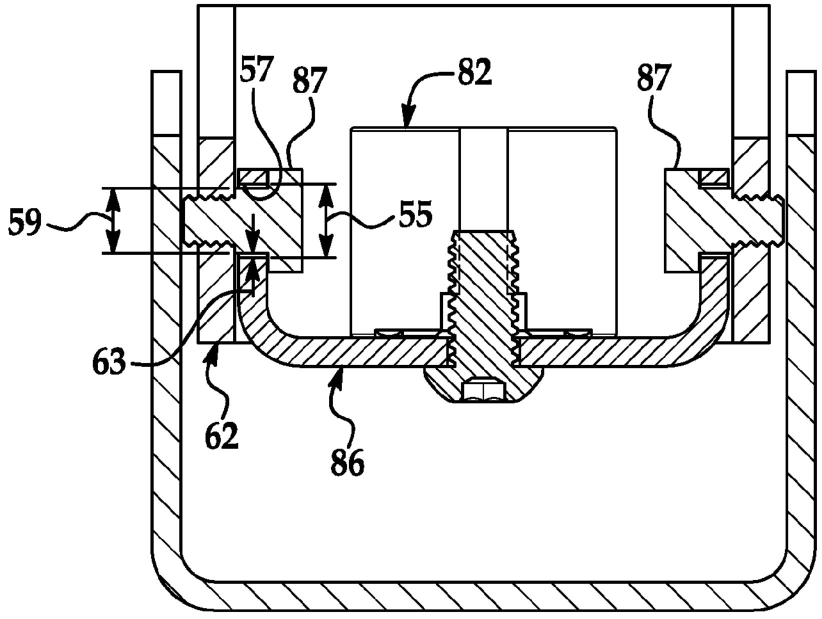
FIG. 6B is a cross-sectional view of the self-aligning mount taken along the 6B-6B line shown in FIG. 5.

Referring now to FIGS. 3 and 4 together, an example of the left hinge area of the cabinet 40 is depicted. Examples of the left hinge area may include a hinge 60 having a first hinge plate 62 pivotally attached to a second hinge plate 64. The first hinge plate 62 is rigidly attached/mounted to the cabinet 40, and the second hinge plate 64 is rigidly attached/mounted to the input device tray 70. It is to be understood that the term "hinge plate" as used herein refers to one operating side of a hinge assembly. A hinge plate may be, but is not necessarily, flat. Rather, in some instances, a hinge plate may have edges bent at various angles, flanges disposed thereon, and/or holes formed therein. It is to be further understood that the attachment of the first hinge plate 62 to the cabinet 40 may be direct, or there may be intervening parts between the first hinge plate 64 and the cabinet 40. For example, a rigid bracket may be included as part of the cabinet 40, or may be disposed thereon, with the first hinge plate 62 being directly attached to the rigid bracket. Such an indirect arrangement between the first hinge plate 62 and the cabinet 40 is included as an example of the first hinge plate 62 being rigidly attached to the cabinet 40.

A second magnetically responsive strike plate 79 may be rigidly mounted to the second hinge plate 64. In the example depicted in FIG. 4, the second magnetically responsive strike plate 79 may be fastened or mated to flanges of the second hinge plate 64 by lap joints or corner joints. The joints may include complementary engagable extensions and grooves or slots. The joints may be fixed by friction, welding, adhesives or fasteners.

Figure 2A:
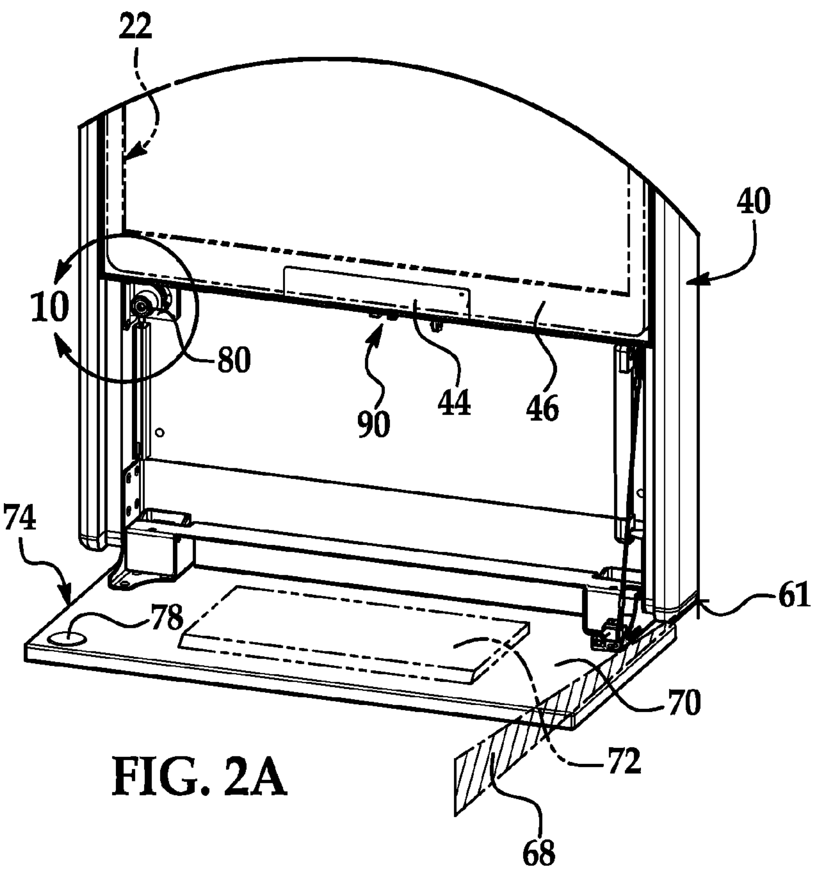
FIG. 2A is a detailed right front perspective view of the lower portion of the example of the wall-mounted computer workstation depicted in FIG. 1A, where a tray of the workstation is illustrated in the operating position.
Figure 2B:
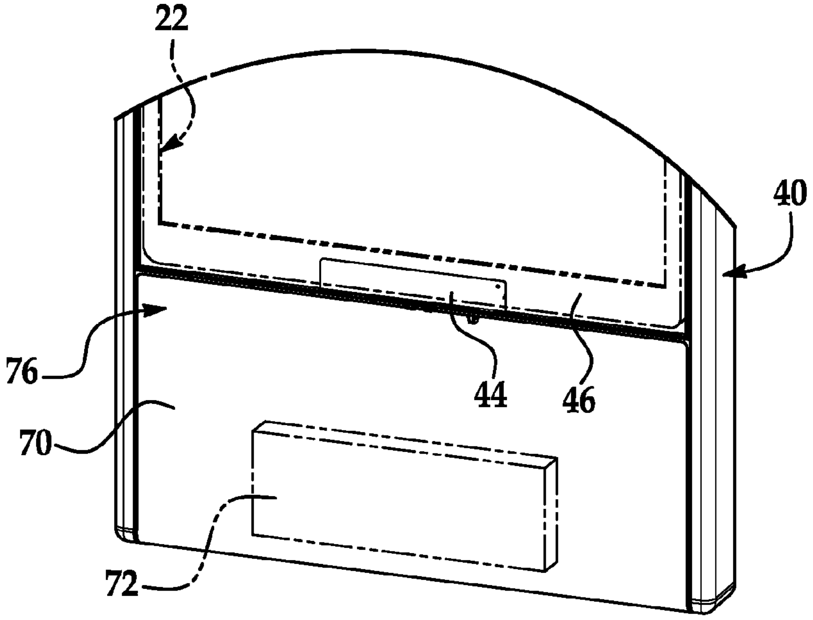
FIG. 2B is a detailed right front perspective view of the lower portion of the example of the wall-mounted computer workstation depicted in FIG. 1A, where the tray is illustrated in the stowed position.

Referring briefly back to FIGS. 2A and 2B, the first electromagnet 80 may selectively magnetically attract the first magnetically responsive strike plate 78 to selectively magnetically retain the input device tray 70 in the stowed position 76. As illustrated in FIGS. 4, 5, 6A and 6B together, the second electromagnet 82 may alignably attach to the first hinge plate 62 via a self-aligning mount 84 to selectively magnetically attract the second magnetically responsive strike plate 79, to selectively draw the input device tray 70 to the operating position 74, and to selectively magnetically retain the input device tray 70 in the operating position 74 when the second electromagnet 82 is in the energized state. When the second electromagnet 82 is in the de-energized state, the electromagnet 82 releases from the second magnetically responsive strike plate 79, which in turn releases the input device tray 70.

A magnetic attraction force respectively between each electromagnet 80, 82 and the respective magnetically responsive strike plate 78, 79 may be 50 pounds or greater. In one example, the magnetic attraction force ranges from about 50 lbf to about 150 lbf. In a second example, the magnetic attraction force may range from 80 lbf to 120 lbf when the electromagnet 80, 82 and the respective strike plate 78, 79 are in contact and the electromagnet 80, 82 is in the energized state.

The self-aligning mount 84 may include a mounting flange 86 rigidly attached to the second electromagnet 82. In one example, two shoulder bolts 87 may be threadingly attached to the first hinge plate 62 through oversized holes 57 in the mounting flange 86. An example of a suitable shoulder bolt is a #10 shoulder bolt, although it is contemplated that others may be used. The oversized holes 57 may have a diameter 55 that is at least 0.025 inches larger than a maximum shoulder diameter 59 of the shoulder bolts. In one example, the oversized holes 57 may have a diameter 55 ranging from about 0.03 inches to about 0.04 inches larger than a maximum shoulder diameter 59 of the shoulder bolts 87. A clearance 63 between the shoulder bolts 87 and the oversized holes 57 enables the second electromagnet 82 to self-align with the second strike plate 79 to maximize the magnetic attraction force therebetween. As one example, the diameter of the respective shoulder bolts 87 may range from 0.246 inches to 0.248 inches, and the diameter of the oversized holes 57 may range from 0.277 inches to 0.282 inches. In this example, the clearance 63 ranges from 0.029 to 0.036.

Maximizing the magnetic attraction force between the second electromagnet 82 and the second strike plate 79 occurs when a substantially flat face of the magnet 82 contacts a substantially flat face of the second strike plate 79. If the second electromagnet 82 were to contact the second strike plate 79 at an edge of the electromagnet 82, then an air gap between most of the face of the magnet 82 and the strike plate 79 would reduce the magnetic attraction force. The oversized holes 57 allow the electromagnet 82 to self-align by rotating and shifting the shoulder bolts 87 in the oversized holes 57 as the second strike plate 79 nears the electromagnet 82.

Figure 7:
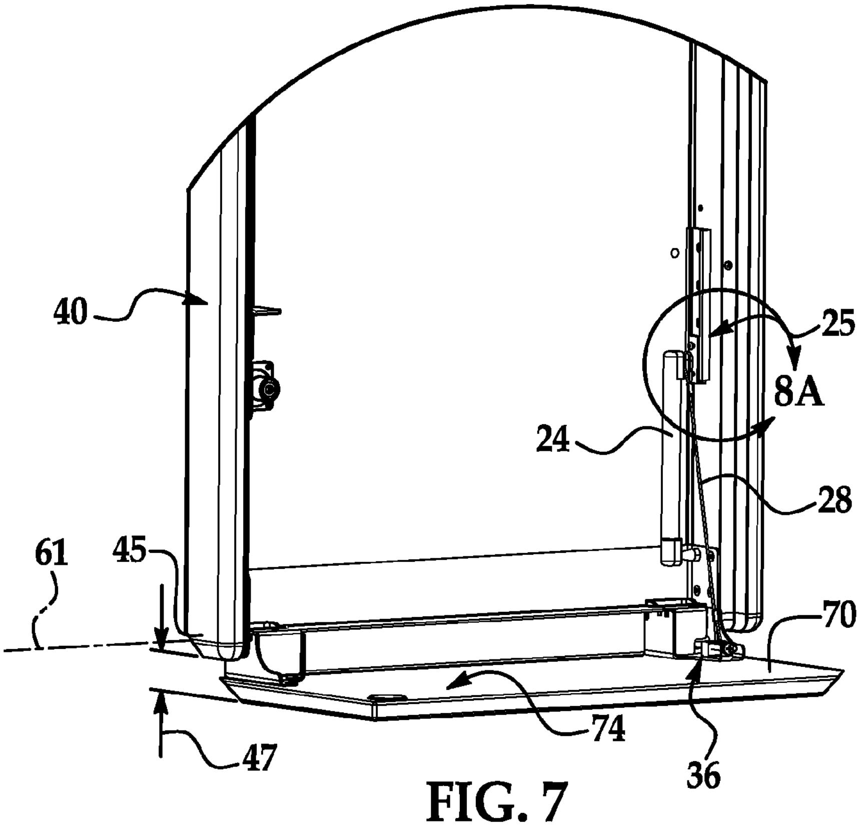
FIG. 7 is a detailed left front perspective view of the lower portion of the example of the wall-mounted computer workstation depicted in FIG. 1, where the tray of the workstation is illustrated in the operating position.

Referring to FIG. 7, in a further example, a center of rotation 61 of the input device tray 70 is substantially through a lowermost rear corner 45 of the cabinet 40 which causes the input device tray 70 to swing below the cabinet 40 a distance that is substantially equal to a thickness 47 of the cabinet 40. This configuration allows the input device tray 70 to sit at a relatively low operating position 74 with respect to the bottom of the cabinet 40. In an example, the input device tray 70 in the operating position 74 may be about 4.5 inches lower than an input device tray with conventional hinge operation. A lower input device tray operating position 74 may be more comfortable for some computer operators 98. Furthermore, having the input device tray 70 at a lower operating position 74 may provide ergonomic comfort to the computer operator 98. Regulations require that a certain clearance be provided in hospital corridors between the floor and the workstation 10 when the tray 70 is in the stowed position 76. For example, current CMS regulations require that workstations be installed at least 40 inches above the floor (see Revision of S&C-04-41, at https://www.cms.gov/SurveyCertificationGenInfo/Downloads/SCLetter10_18.pdf dated May 14, 2010). The design of the workstation 10 disclosed herein allows these regulations to be met while also allowing for the desirably lower input device tray operating position 74.

As illustrated in FIGS. 7, 8A, 8B and 9, examples of the wall-mounted computer workstation 10 may further include a gas-spring 24 attached to the cabinet 40 to cause a tension force 26 in a cable 28. The cable 28 may be attached to an adjustable crank-arm 36 mounted on the tray 70. The tension force 26 in the cable 28 exerted on the crank-arm 36 produces a closing torque 94 to rotate the tray 70 toward the stowed position 76 (see FIG. 2B) when the second electromagnet 82 is in the de-energized state. Adjustment of the closing torque 94 accommodates input devices 72 having different masses. For example, the tray 70 having a heavy keyboard and mouse thereon may close reliably with greater closing torque 94, while a lightweight keyboard and/or mouse would allow the tray 70 to close with a lower closing torque 94.

The gas-spring 24 may be biased to elongate. In other words, if no external load is placed on the gas-spring 24, the gas-spring 24 will extend to the maximum length. Thus, in the example illustrated in FIG. 7, the gas-spring 24 tends to pull on the cable 28 and lift the tray 70. When a computer operator 98 rotates the tray 70 toward the operating position 74, the computer operator 98 works against the gas-spring 24 until the tray 70 is held in the operating position 74 by the second electromagnet 82. If the tray 70 is released outside of the magnetic engagement zone 68 (see FIG. 2A), the tray 70 will be moved toward the stowed position 76 by the gas-spring 24.

Figure 8A:
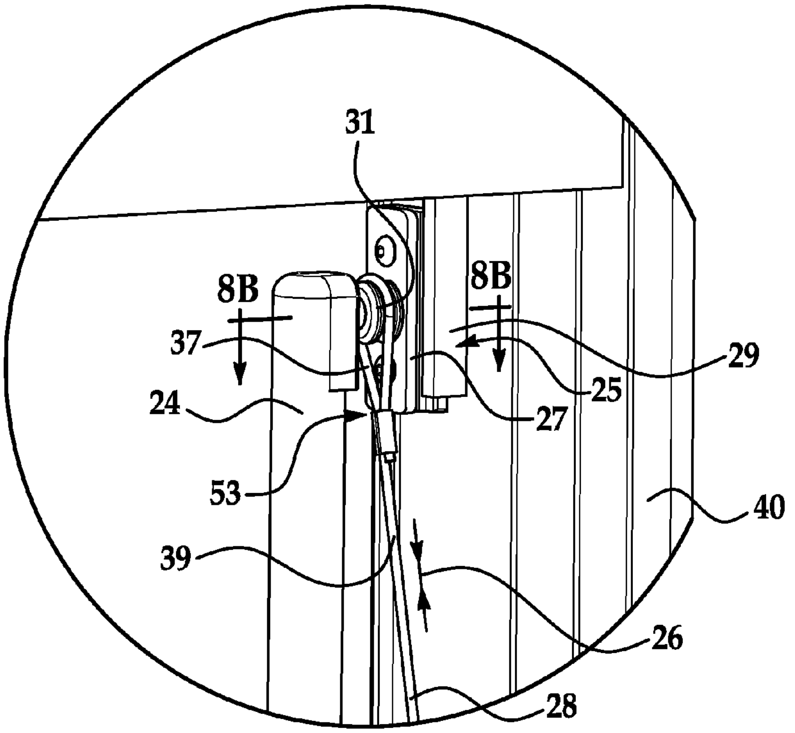
FIG. 8A is a detailed left front perspective view of the linear slider assembly and gas spring depicted in FIG. 7.
Figure 8B:
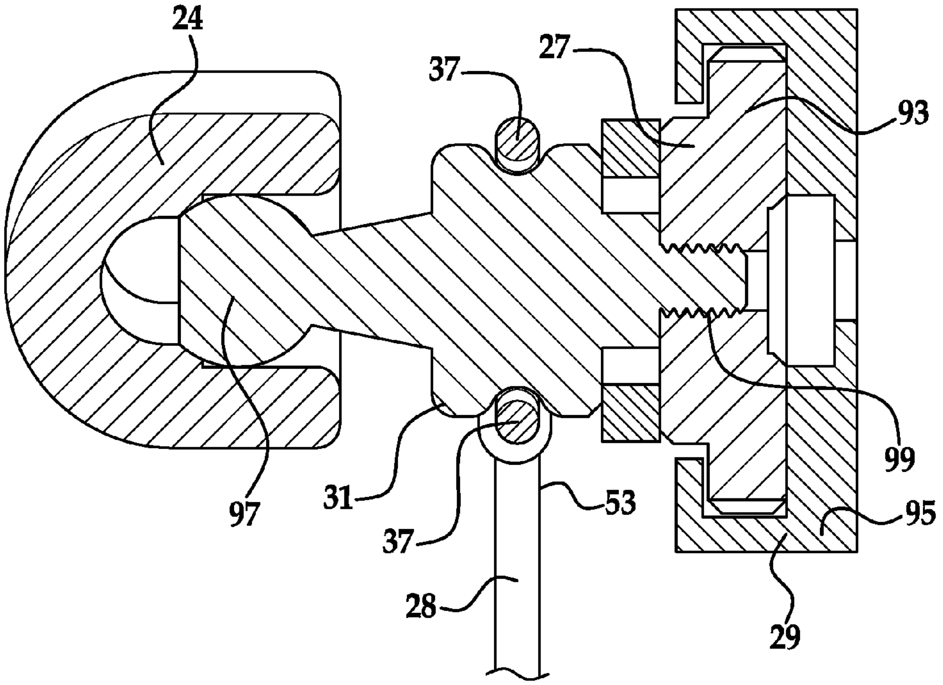
FIG. 8B is a top cross-sectional view of the linear slider assembly taken along the 8B-8B line of FIG. 8A.

An example of the disclosed wall-mounted computer workstation 10 may further include a linear slider assembly 25 disposed on the cabinet 40 (see, e.g., FIGS. 7 through 8B). The linear slider assembly 25 may have a sliding member 27 and a stationary member 29. The sliding member 27 may include a male slide member 93 and the stationary member 29 may include a female slide member 95 complementarily shaped to slidingly receive the male slide member 93. A post 31 may be disposed on the sliding member 27. The post 31 may include screw threads 99 for attachment to the sliding member 27, and may include a ball end 97 distal to the screw threads 99 for attachment to the gas-spring 24.

Figure 9:
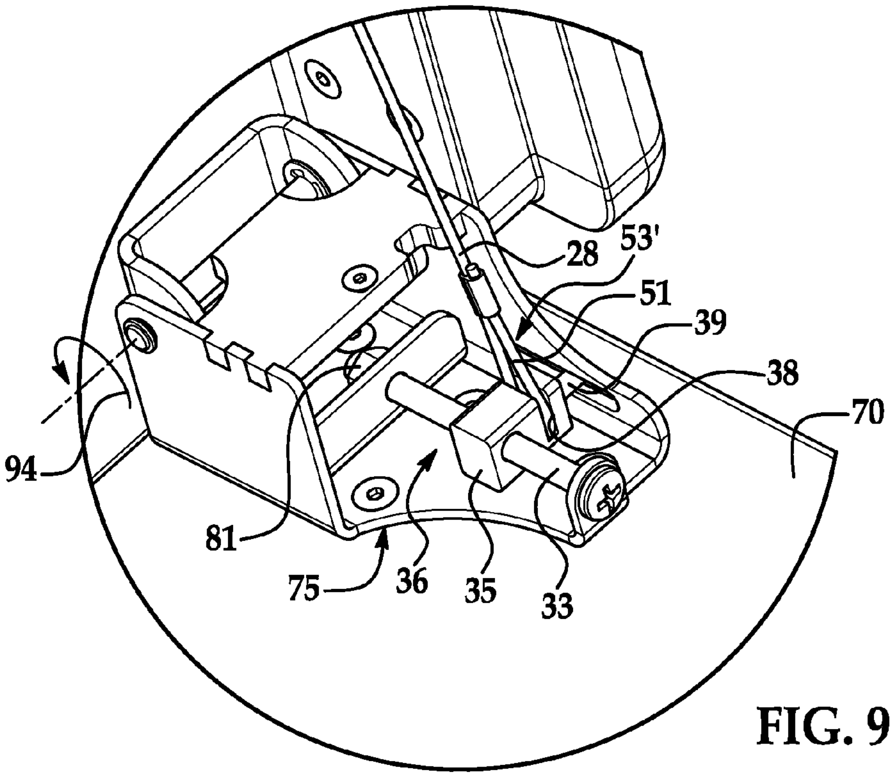
FIG. 9 is a detailed left front perspective view of the right hinge area depicted in FIG. 7 illustrated with the fascia removed.

As illustrated in FIGS. 8B and 9, the adjustable crank-arm 36 may include a leadscrew 33 rotatably attached to a tray-mounted hinge plate 75 and a complementary nut 35 operably disposed on the leadscrew 33. The nut 35 may have a slot 38 formed therein and a clevis pin 39 disposed orthogonally through the slot 38. A locknut 81 may substantially prevent the leadscrew 33 from moving axially with respect to the tray-mounted hinge plate 75.

The cable 28 may have a first loop 37 formed on a slider end 53 of the cable 28 and a second loop 51 formed on a distal end 53' of the cable 28. The first loop 37 may engage the post 31 and the second loop 51 may engage the clevis pin 39 to transmit tensile force from the gas-spring 24 through the cable 28 to the nut 35 to exert the closing torque 94 on the input device tray 70.

Turning the leadscrew 33 causes the nut 35 to move along the leadscrew 33, thereby changing the length of the adjustable crank-arm 36, which adjusts the closing torque 94.

Figure 10:
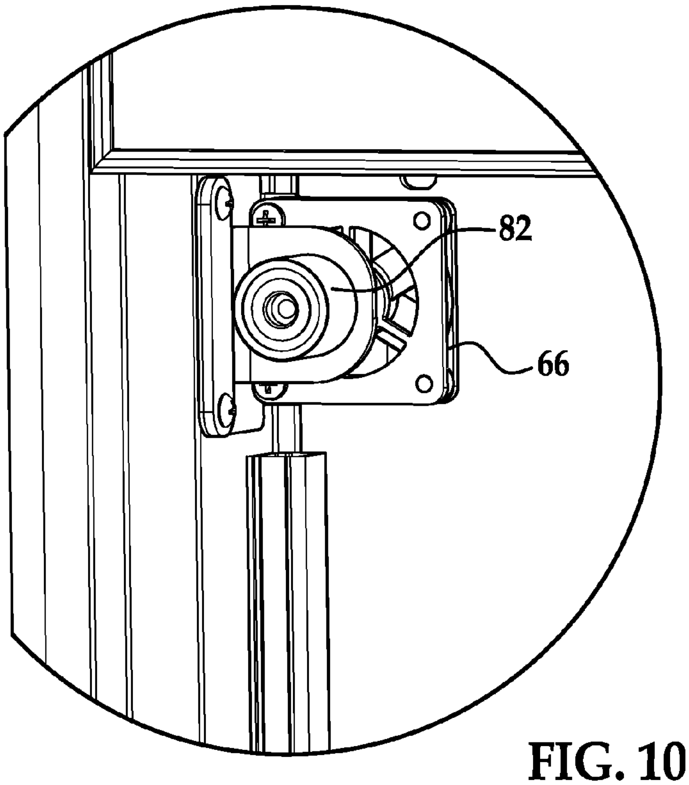
FIG. 10 is a detailed right front perspective view of the electromagnet and cooling fan depicted in FIG. 2A.

FIG. 10 illustrates a portion of an example of the wall-mounted computer workstation 10, including a cooling fan 66 disposed adjacent the second electromagnet 82. The cooling fan 66 cools the second electromagnet 82 when the input device tray 70 is in the stowed position 76. It is to be understood that the second electromagnet 82 may be energized for extended periods of time with the input device tray 70 in the stowed position 76 thereby having reduced cooling by natural convection. A non-limiting example of a suitable cooling fan 66 is a Panaflo Fan Sprite DC Brushless # FBK-06A12H, available at www.blowerwheel.com. The FBK-06A12H is a nominal 2 inch, square frame, 12 volt, muffin fan. Larger or smaller fans may also be suitable. The fan 66 may be powered when the tray 70 is in the stowed position 76, or may be thermostatically controlled based on a temperature of the second electromagnet 82. Suitable electronics are included and programmed to operate the fan 66 in the desired manner.

Figure 12:
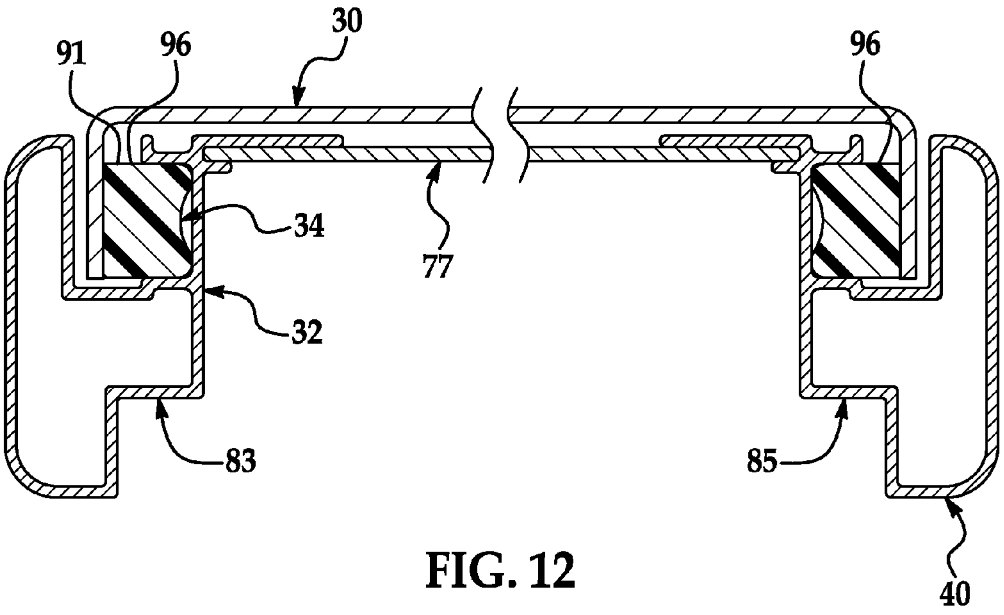
FIG. 12 is a partial top cross-sectional view illustrating an interface between a bearing and a track in an example of the wall-mounted computer workstation of the present disclosure.

Referring now to FIG. 12, a partial top cross-sectional view of the interface between a bearing 34 and a track 32 is depicted. The bearing 34 may be affixed to the mounting bracket 30 and operably engaged with the track 32. The bearing 34 substantially prevents relative motion between the mounting bracket 30 and the track 32 in all directions other than vertical. Thus, the bearing 34 constrains the cabinet 40 to moving up and down relative to the wall 20.

As illustrated in FIG. 12, the track 32 may include a first rail 83 and a second rail 85. The first and second rails 83, 85 may be extrusions formed from aluminum or aluminum alloys. In another example, the first and second rails 83, 85 may be formed from steel. In still a further example, the first and second rails 83, 85 may be formed from a plastic or plastic composite. It is to be understood that the track 32 may have a single rail (not shown), or the track 32 may have intervening parts between the first rail 83 and the second rail 85. For example, a web sheet 77 may be disposed between the first rail 83 and the second rail 85. The web sheet 77 may function as a back of the cabinet 40 and as a mounting board for attachment of components (not shown) within the cabinet 40. The web sheet 77 may be formed from wood, metal, glass, plastic and/or composites, and/or combinations thereof.

The bearing 34 may be a sliding bearing 91 or a roller bearing (not shown). The sliding bearing 91 may be formed from plastic(s), metal(s), or composite material(s). Suitable materials for a sliding bearing 91 may exhibit relatively low friction when sliding on the track 32. The sliding bearing 91 may be formed, for example, from nylon, TEFLON® (DuPont), and/or DELRIN®(DuPont). The sliding bearing 91 may be made from brass, or brass impregnated with a lubricating material including oil, graphite or TEFLON®. Composites may include combinations of plastics, glasses, and/or metals. Roller bearings (not shown) may include caged roller bearings, needle bearings, and ball bearing slides similar to those found in a file cabinet (not shown). Although the bearing 34 depicted in FIG. 12 is shown having a plurality of similar pieces 96 disposed on the mounting bracket 30, a one-piece bearing (not shown) may also be used in one example.

A computer monitor 22 may be mounted to the cabinet 40. (See FIG. 1A). The computer monitor 22 may be a Liquid Crystal Display (LCD), Light Emitting Diode (LED) display, plasma display, Cathode Ray Tube (CRT), thin film display, or other display for providing changeable visual information to a computer operator 98. The wall-mounted computer workstation 10 may control power to the computer monitor 22, and switch off the power to the computer monitor 22 to prevent visual access to the monitor 22 when an abandoned computer session is detected (e.g., by the sensor 90).

In an example of using the computer workstation 10, a computer operator 98 enters, for example, a 4 digit or 5 digit (or other) code via a keypad on the electronic lock control panel 44. The electronic lock control panel 44 sends electronic signals 56 corresponding to the 4 digit or 5 digit code to the lock control module 48 by wires, or by wireless network communication (for example BLUETOOTH®, Bluetooth Sig. Inc.). The lock control module 48 authenticates that the signals 56 indicate that an authorized code has been entered, stops electric current flow 58 to the first electromagnet 80, and switches current flow 58' through the second electromagnet 82. After the first electromagnet 80 is de-energized, the authenticated computer user 98' may grasp the input device tray 70 and manually rotate the tray 70 to the operating position 74. The second electromagnet 82 will hold the tray 70 in the operating position 74. As long as the electronic lock control module 48 determines, based on input from the electronic lock control panel 44 and the non-contacting sensor 90 that the authenticated computer user 98' remains at the workstation 10, the tray 70 is held in the operating position 74. In one example, the lock control module 48 may revoke authentication if the non-contacting sensor 90 no longer senses and indicates the presence of the authenticated computer operator 98'. For example, if the authenticated user 98' walks away from the workstation 10 and the sensor 90 does not sense his/her presence for a predetermined time, the lock control module 48 will revoke authentication and de-energize the second electromagnet 82. The predetermined time may be programmable, and thus may range anywhere from 1 second to an indefinite time. In an example, the predetermined time is set at 3 seconds. In some instances, the time trigger may be disabled, and thus an operator 98, 98' would push a close button on the electronic lock control panel 33 to close the tray 70. As such, the computer operator 98/authenticated computer operator 98' may cause authentication to be revoked by, for example, pressing a predetermined key or sequence of keys on the electronic lock control panel 44, or walking away (as previously described). In an example, the predetermined key on the electronic lock control panel 44 may be indicated by a "close" symbol, e.g. a closed padlock-shaped icon (not shown).

It is to be understood that the ranges provided herein include the stated range and any value or sub-range within the stated range. For example, an amount ranging from about 0.5 inch to about 1.0 inch should be interpreted to include not only the explicitly recited amount limits of about 0.5 inch to about 1.0 inch, but also to include individual amounts, such as 0.7 inch, 0.8 inch, 0.9 inch, etc., and sub-ranges, such as 0.6 inch to 0.9 inch, etc. Furthermore, when "about" is utilized to describe a value, this is meant to encompass minor variations (up to +/−10%) from the stated value.

While several examples have been described in detail, it will be apparent to those skilled in the art that the disclosed examples may be modified. Therefore, the foregoing description is to be considered non-limiting.

What is claimed is:

1. A wall-mounted computer workstation, comprising:

a mounting bracket for fixable attachment to a wall;

a cabinet operatively connected to the mounting bracket, the cabinet having a front side to face away from the wall, and a rear side to be adjacent to the wall;

a track rigidly attached to the cabinet and operably engaged with the mounting bracket to guide the cabinet in a vertical direction;

a non-contacting sensor operably disposed on the cabinet to detect a presence of a computer operator;

an input device tray to receive at least one computer input device, the tray rotatably connected to the cabinet, the tray having an operating position such that the at least one computer input device is held in an input position and having a stowed position such that access to the at least one computer input device is substantially prevented;

a first electromagnet disposed on the cabinet to selectively magnetically retain the input device tray in the stowed position;

a second electromagnet disposed on the cabinet to selectively magnetically retain the input device tray in the operating position;

an electronic lock control panel operably disposed on an exterior surface of the cabinet to accept authentication input from the operator; and an electronic lock control module disposed in a lockable compartment of the cabinet, the lock control module connected to receive signals from the electronic lock control panel and the non-contacting sensor, the lock control module connected to the first and second electromagnets to separately control electric current flow through the first and second electromagnets in response to an authentication by the lock control module.

2. The wall-mounted computer workstation as defined in claim 1 wherein:

the authentication causes the first electromagnet to release the input device tray to allow the tray to be rotated into a magnetic engagement zone and to be magnetically retained by the second electromagnet in the operating position until authentication is revoked; and an absence of the authentication causes the second electromagnet to release the input device tray such that the tray automatically rotates to the stowed position and is retained in the stowed position.

3. The wall-mounted computer workstation as defined in claim 1 wherein a center of rotation of the input device tray is substantially through a lowermost rear corner of the cabinet which causes the input device tray to swing below the cabinet a distance that is substantially equal to a thickness of the cabinet.

4. The wall-mounted computer workstation as defined in claim 1, further comprising:

a hinge having a first hinge plate pivotally attached to a second hinge plate, the first hinge plate rigidly attached to the cabinet and the input device tray rigidly mounted to the second hinge plate;

a first magnetically responsive strike plate disposed on the input device tray; and a second magnetically responsive strike plate rigidly mounted to the second hinge plate;

and wherein:

the first electromagnet selectively magnetically attracts the first magnetically responsive strike plate to selectively magnetically retain the input device tray in the stowed position; and the second electromagnet alignably attaches to the first hinge plate via a self-aligning mount to selectively magnetically attract the second magnetically responsive strike plate, to selectively draw the input device tray to the operating position, and to selectively magnetically retain the input device tray in the operating position when the second electromagnet is in an energized state and release the input device tray when the second electromagnet is in a de-energized state.

5. The wall-mounted computer workstation as defined in claim 4 wherein a magnetic attraction force between each electromagnet and the respective magnetically responsive strike plate is from 50 lbf to 150 lbf when the electromagnet and the respective strike plate are in contact and the electromagnet is in the energized state.

6. The wall-mounted computer workstation as defined in claim 4, further comprising a cooling fan disposed adjacent the second electromagnet to cool the second electromagnet when the input device tray is in the stowed position.

7. The wall-mounted computer workstation as defined in claim 4, wherein the self-aligning mount includes:

a mounting flange rigidly attached to the second electromagnet; and two shoulder bolts threadingly attached to the first hinge plate through oversized holes in the mounting flange, the oversized holes having a diameter ranging from about 0.03 inch to about 0.04 inch larger than a maximum shoulder diameter of the shoulder bolts, wherein a clearance between the shoulder bolts and the oversized holes enables the second electromagnet to self-align with the second strike plate to maximize a magnetic attraction force therebetween.

8. The wall-mounted computer workstation as defined in claim 1, further comprising a gas-spring attached to the cabinet to cause a tension force in a cable attached to an adjustable crank-arm mounted on the tray which produces a closing torque adjustable to rotate the tray to the stowed position when the second electromagnet is in a de-energized state.

9. The wall-mounted computer workstation as defined in claim 8 wherein the gas-spring is biased to elongate.

10. The wall-mounted computer workstation as defined in claim 8, further comprising:

a linear slider assembly having a sliding member and a stationary member, the linear slider assembly disposed on the cabinet; and a post disposed on the sliding member;

and wherein:

the adjustable crank-arm includes a leadscrew rotatably attached to the second hinge plate and a complementary nut operably disposed on the leadscrew, the nut having a slot formed therein and a clevis pin disposed orthogonally through the slot;

the cable has a first loop formed on a slider end of the cable and a second loop formed on a distal end of the cable, the first loop engaging the post and the second loop engaging the clevis pin to transmit tensile force from the gas-spring through the cable to the nut to exert the closing torque on the input device tray; and turning the leadscrew causes the nut to move along the leadscrew, which adjusts the closing torque.

11. The wall-mounted computer workstation as defined in claim 10 wherein the sliding member includes a male slide member and the stationary member includes a female slide member complementarily shaped to slidingly receive the male slide member.

12. The wall-mounted computer workstation as defined in claim 1, further comprising:

a bearing affixed to the mounting bracket and operably engaged with the track, the bearing substantially preventing relative motion between the mounting bracket and the track in all directions other than vertical.

13. The wall-mounted computer workstation as defined in claim 1, further comprising an electric-powered linear drive assembly rigidly attached to the cabinet and operably connected to the mounting bracket for adjusting a vertical position of the cabinet along the track.

14. The wall-mounted computer workstation as defined in claim 1, further comprising a computer monitor mounted to the cabinet.

15. The wall-mounted computer workstation as defined in claim 1 wherein the non-contacting sensor is chosen from an infra-red sensor, an ultra-sonic sensor, a biometric sensor, a microphone, and combinations thereof.

* * * * *